(12) United States Patent
Lanson et al.

(10) Patent No.: US 11,609,248 B2
(45) Date of Patent: Mar. 21, 2023

(54) CURRENT TRANSDUCER WITH INTEGRATED PRIMARY CONDUCTOR

(71) Applicant: LEM INTERNATIONAL SA, Plan-les-Ouates (CH)

(72) Inventors: Jean-François Lanson, Reignier-Esery (FR); Pascal Morel, Saint Pierre en Faucigny (FR)

(73) Assignee: LEM International SA, Plan-les-Ouates (CH)

( * ) Notice: Subject to any disclaimer, the term of this patent is extended or adjusted under 35 U.S.C. 154(b) by 17 days.

(21) Appl. No.: 17/259,055

(22) PCT Filed: Jul. 8, 2019

(86) PCT No.: PCT/EP2019/068302
§ 371 (c)(1),
(2) Date: Jan. 8, 2021

(87) PCT Pub. No.: WO2020/011732
PCT Pub. Date: Jan. 16, 2020

(65) Prior Publication Data
US 2021/0141004 A1 May 13, 2021

(30) Foreign Application Priority Data

Jul. 11, 2018 (EP) ..................................... 18183025

(51) Int. Cl.
*G01R 15/20* (2006.01)
*H01L 43/04* (2006.01)
(Continued)

(52) U.S. Cl.
CPC ............ *G01R 15/207* (2013.01); *H01L 43/04* (2013.01); *H01L 43/065* (2013.01); *H01L 43/14* (2013.01)

(58) Field of Classification Search
CPC ..... G01R 15/207; H01L 43/04; H01L 43/065; H01L 224/48247; H01L 224/97
See application file for complete search history.

(56) References Cited

U.S. PATENT DOCUMENTS 6,976,901 B1 * 12/2005 Halley .................... B24B 37/04
451/6
11,112,435 B2 * 9/2021 Peccoux .............. G01R 15/202
(Continued)

FOREIGN PATENT DOCUMENTS

DE 19811566 9/1999
JP 2003043074 2/2003
(Continued)

OTHER PUBLICATIONS

International Search Report issued by the European Patent Office, dated Sep. 24, 2019, for International Patent Application No. PCT/EP2019/068302; 3 pages.
(Continued)

*Primary Examiner* — Dominic E Hawkins
(74) *Attorney, Agent, or Firm* — Faegre Drinker Biddle & Reath LLP

(57) ABSTRACT

Electrical current transducer including an insulating body, a magnetic core comprising a central passage and a magnetic circuit gap, a magnetic field detector positioned in the magnetic circuit gap, and a sheet metal leadframe conductor arrangement comprising a primary conductor for carrying the current to be measured and secondary conductors for connecting the magnetic field detector to an external circuit, the primary conductor comprising a central portion extending through the central passage of the magnetic core, lateral extension arms extending from opposite ends of the central portion, and connection ends for connection to an external conductor, the secondary conductors comprising a plurality of conductors, each conductor comprising a sensing cell connection pad substantially aligned with the central portion of the primary conductor and a connection end for connection to the external circuit, the insulating body comprising an inner overmold portion surrounding a central portion of the primary conductor and forming a core guide positioning and insulating the magnetic core with respect to the leadframe conductor arrangement. The insulating body further comprises an outer overmold portion molded over the inner overmold portion, the magnetic core, magnetic field sensor, and a central portion of the leadframe conductor arrangement.

13 Claims, 9 Drawing Sheets

(51) Int. Cl.
*H01L 43/06* (2006.01)
*H01L 43/14* (2006.01)

(56) References Cited

U.S. PATENT DOCUMENTS

| | | | |
|---|---|---|---|
| 2004/0080308 A1* | 4/2004 | Goto | G01R 19/0092 |
| | | | 324/117 H |
| 2006/0119343 A1* | 6/2006 | Saito | B60R 16/0239 |
| | | | 324/251 |
| 2013/0293226 A1* | 11/2013 | Onuma | G01R 33/02 |
| | | | 324/253 |
| 2017/0010310 A1* | 1/2017 | Morel | H01R 13/6683 |
| 2017/0040239 A1* | 2/2017 | Glenn | H01L 23/49562 |

FOREIGN PATENT DOCUMENTS

| | | | | |
|---|---|---|---|---|
| WO | 2017/067849 | 4/2017 | | |
| WO | WO-2017067849 A1 * | 4/2017 | | G01R 15/202 |

OTHER PUBLICATIONS

Written Opinion issued by the European Patent Office, dated Sep. 24, 2019, for International Patent Application No. PCT/EP2019/068302; 7 pages.

\* cited by examiner

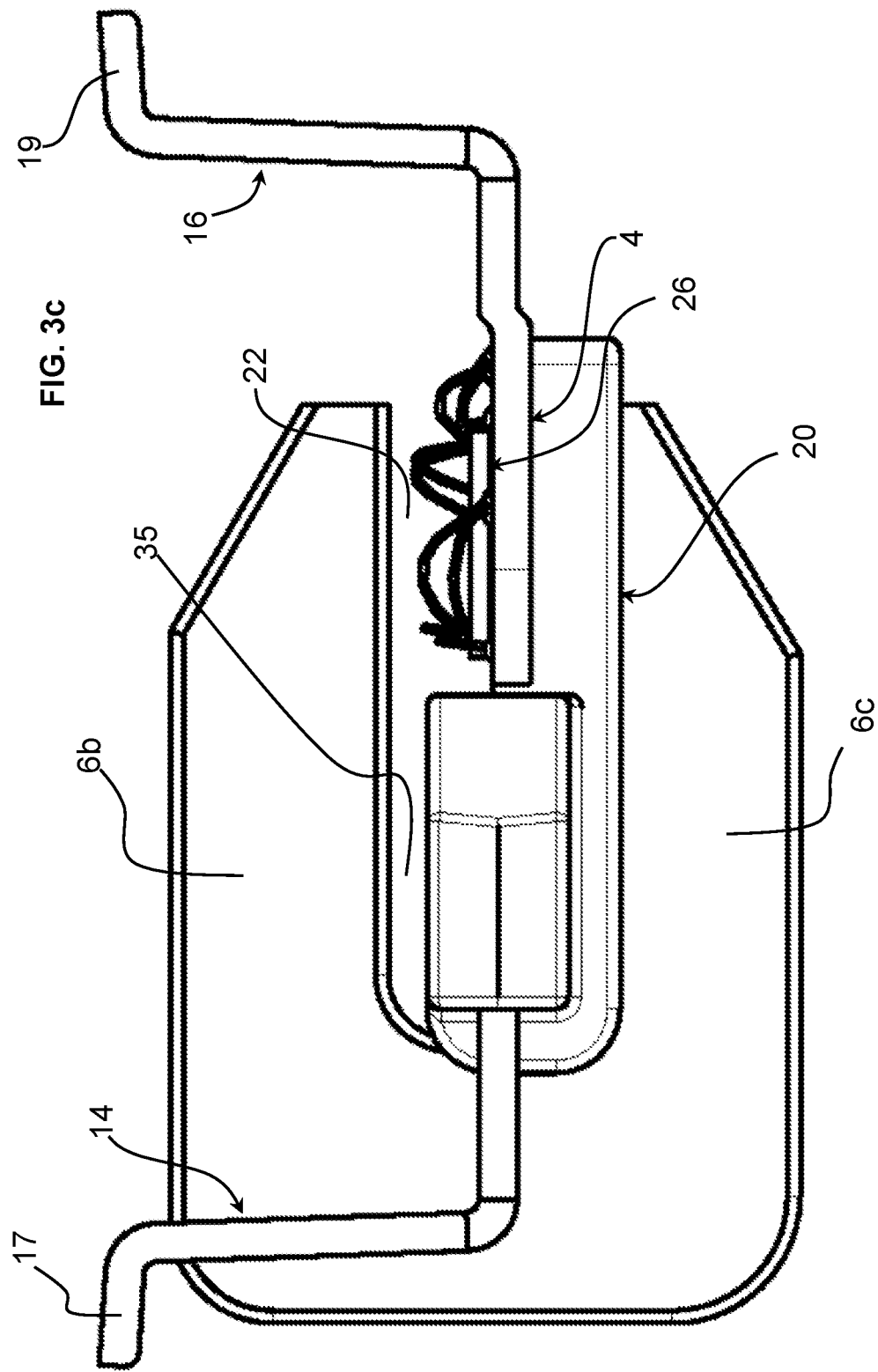

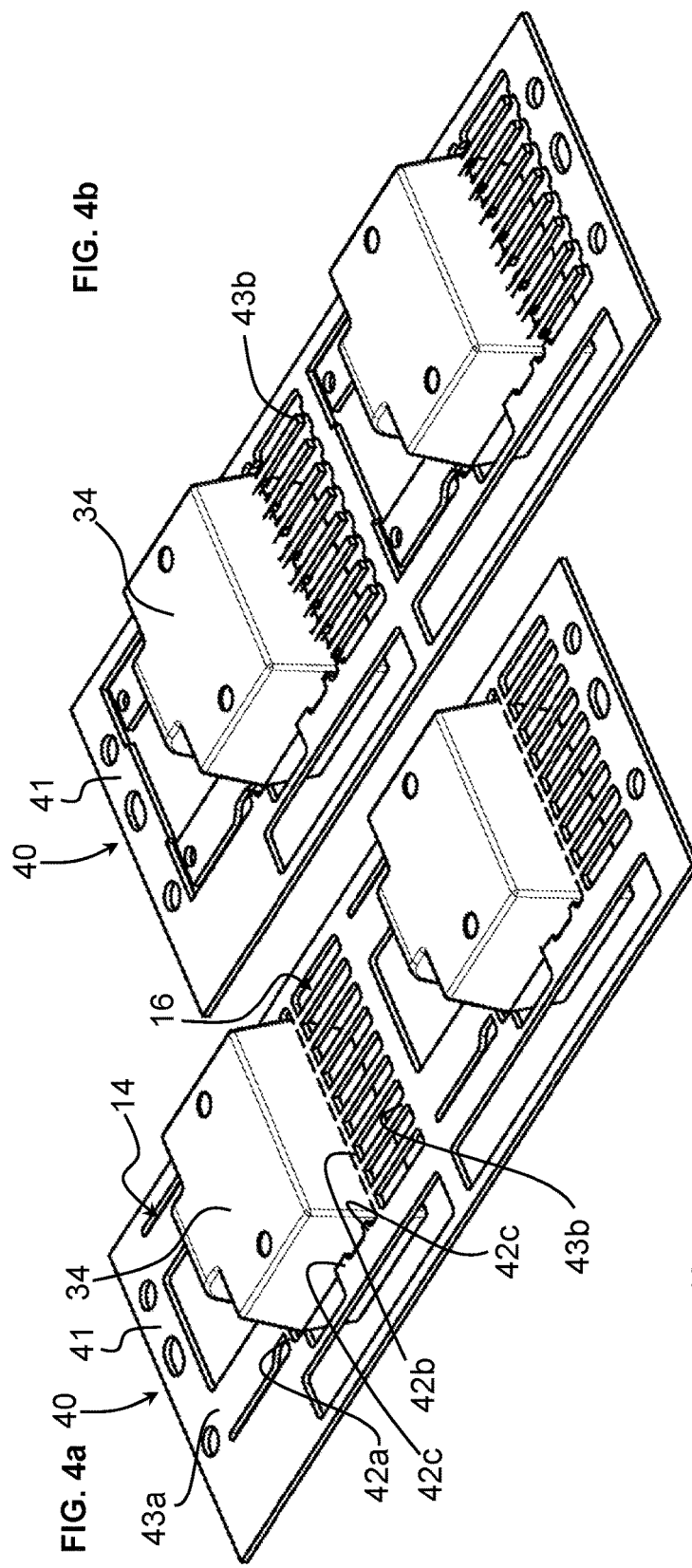
FIG. 4a
FIG. 4b
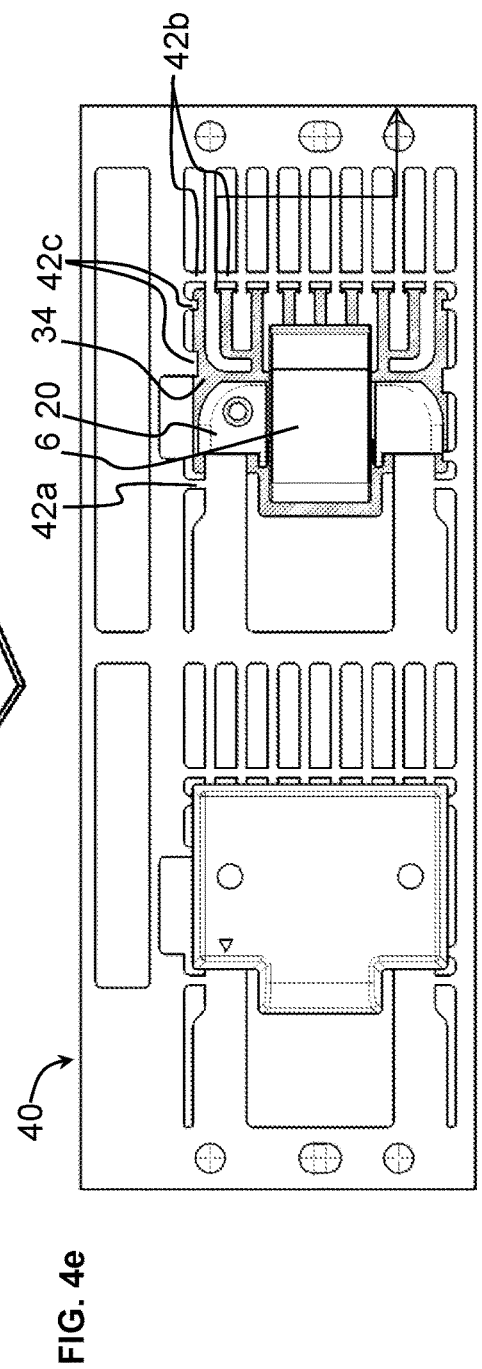
FIG. 4e

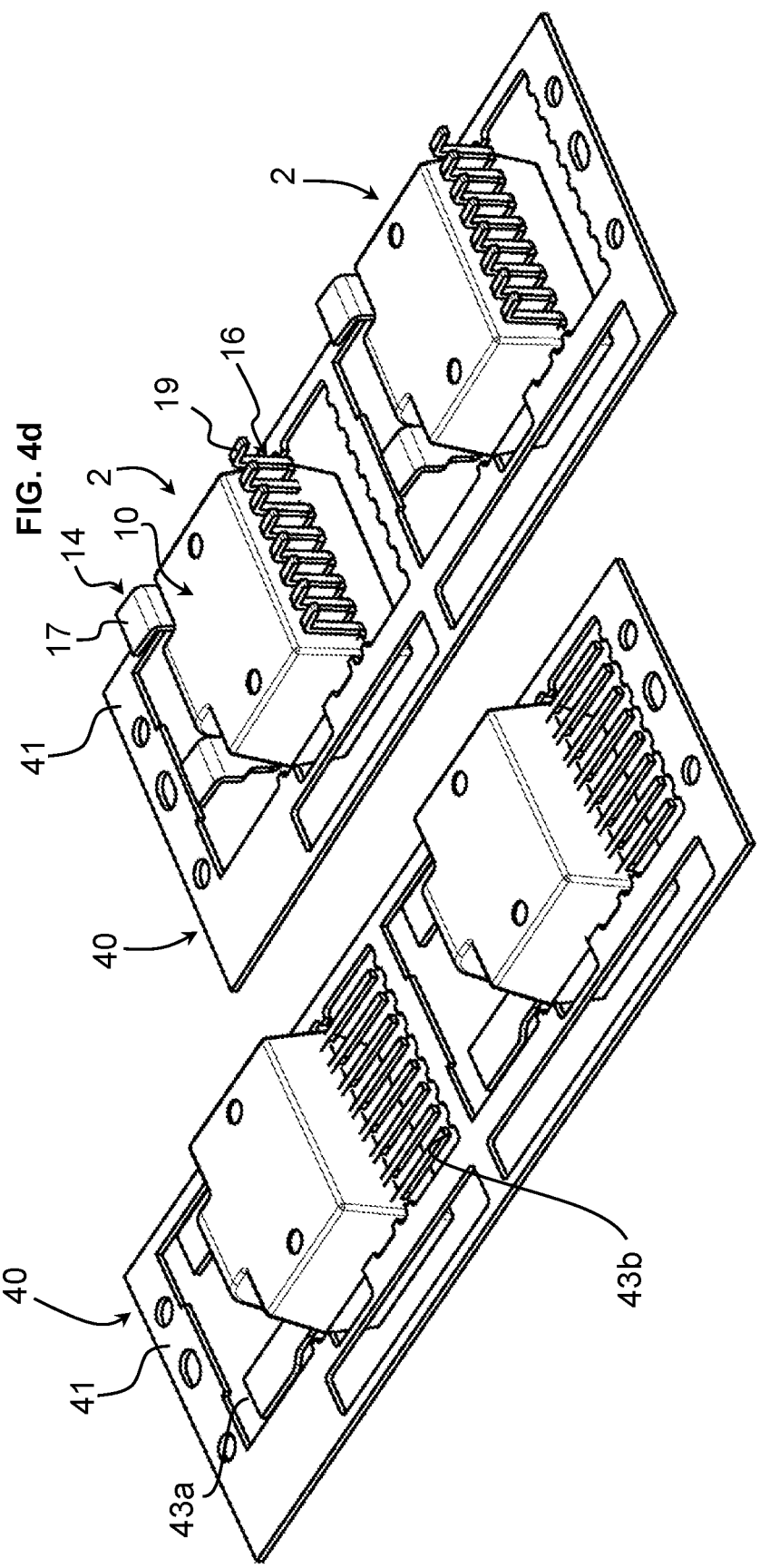

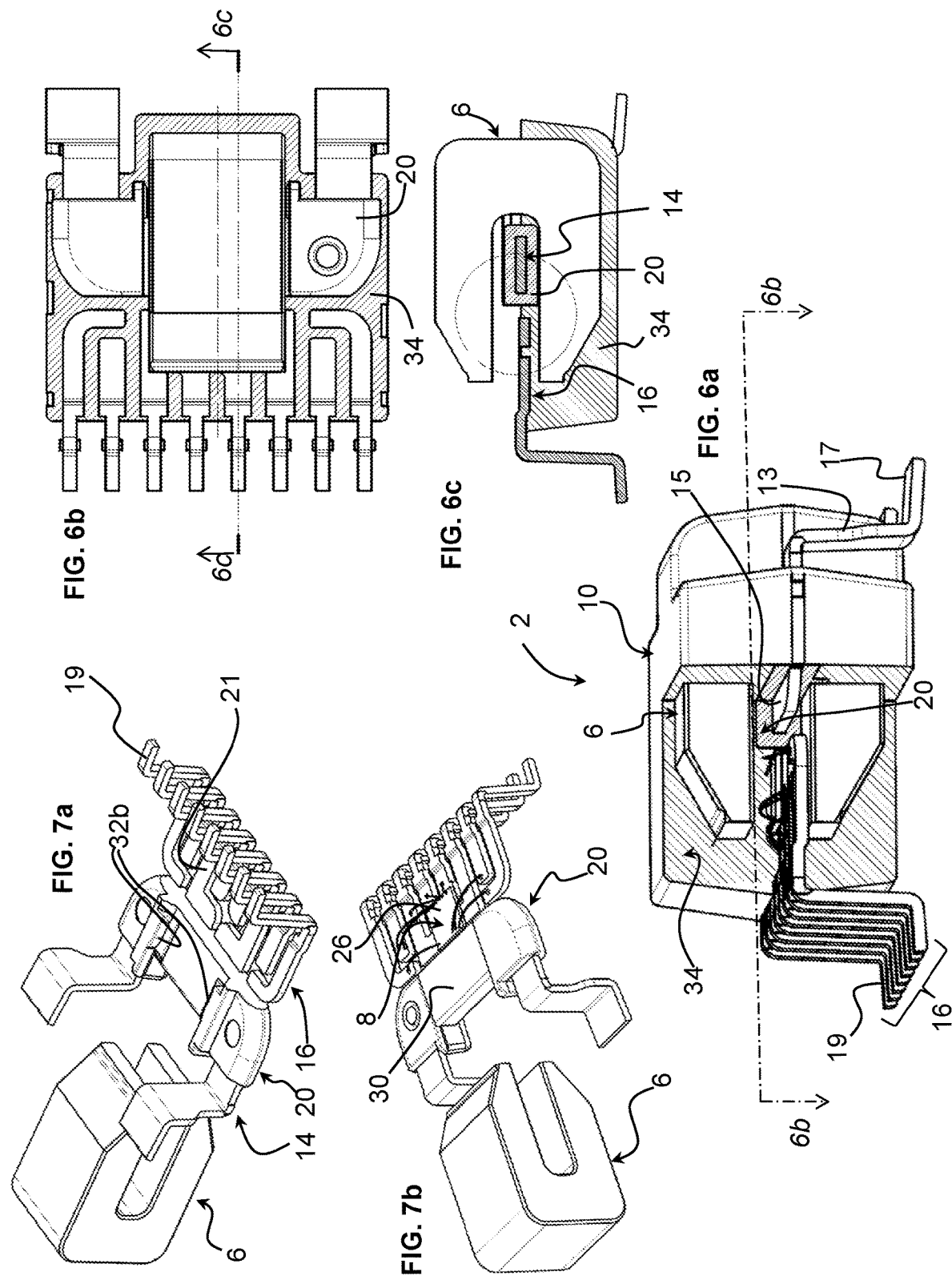

CURRENT TRANSDUCER WITH INTEGRATED PRIMARY CONDUCTOR

CROSS-REFERENCE TO RELATED APPLICATIONS

The present application is a national stage entry of International (PCT) Patent Application Number PCT/EP2019/068302, filed Jul. 8, 2019, which claims priority to European Patent Application No. 18183025.8, filed Jul. 11, 2018, the subject matter of which are expressly incorporated herein by reference.

The present invention relates to an electric current transducer comprising a magnetic core and a magnetic field detector in an air-gap of the magnetic core, for measuring an electrical current flowing in a primary conductor extending through a central passage of the magnetic core.

Electrical current sensors are used in a large variety of applications for monitoring or controlling electrical devices and system and in many applications there is an important advantage in reducing the manufacturing cost of such components and also the costs of implementing and using the components in an electrical circuit.

Although certain current transducers are provided without a magnetic core for cost and/or size reasons, this generally reduces reliability and/or sensitivity and/or accuracy and/or operating range of the transducer compared to one provided with a magnetic core surrounding the primary conductor. Therefore, many electrical current transducers for current sensing applications comprise a magnetic core made of a high permeability magnetic material, surrounding a central aperture through which passes a primary conductor carrying the current to be measured. The difficulty however is to provide a particularly compact current transducer with magnetic core in order to miniaturize and/or reduce the weight of the devices in which the components are mounted. There are also many applications in which the current transducer is mounted on a circuit board and needs to respect a predefined connection footprint or a surface area limitation or a height limitation that requires a particularly compact arrangement. Depending on the voltage amplitude of the primary conductor, this can lead to difficulties in achieving the required electrical creepage distances between the primary conductor and the electrical conductors of the magnetic field detector circuit.

A current transducer mountable on a PCB that meets the aforementioned requirements of compactness, accurate measurement and economical manufacturing is described in WO2017/067849. In this transducer, a leadframe conductor arrangement is overmolded with a housing base, and the magnetic field sensing cell is then mounted on the conductor arrangement and connected thereto by wire bonding. The magnetic core is inserted over the primary conductor and magnetic field sensor before a housing cover is mounted over the core and detector and clipped to the housing base. The interior of the housing may be unfilled (contain air) or filled with an insulating potting material. Despite the holding of the magnetic core by the housing cover and base, under conditions of vibration or mechanical shock, small movements between the core and housing may occur that impart stresses in the transducer that could lead to failure, or to movement of the airgap relative to the magnetic field sensor that affect the precision of the transducer. Moreover, arc tracking between the primary conductor and the magnetic core or the magnetic field detectors, in view of the small separation distances, may be difficult to avoid especially for high current measurement applications. Deformation of the housing base and the cover may also augment such problems under thermal and mechanical stresses.

An object of the invention is to provide an electrical current transducer for mounting on a circuit board, with integrated primary conductor, magnetic field detector and magnetic core, which is accurate and reliable, yet very compact and robust, especially when subject to mechanical and thermal stresses.

It is advantageous to provide an electrical current transducer that has a high electrical tracking resistance between the primary conductor and conductors of the magnetic field detector.

It is advantageous to provide an electrical current transducer that has a large operating range.

It is advantageous to provide an electrical current transducer that is lightweight.

It is advantageous to provide an electrical current transducer that is easy to implement and economical to use.

Objects of the invention have been achieved by providing a current transducer according to claim 1 and a method of producing a current transducer according to claim 11.

Disclosed herein is an electrical current transducer including an insulating body, a magnetic core comprising a central passage and a magnetic circuit gap, a magnetic field detector positioned in the magnetic circuit gap, and a sheet metal leadframe conductor arrangement comprising a primary conductor for carrying the current to be measured and secondary conductors for connecting the magnetic field detector to an external circuit. The primary conductor comprises a central portion extending through the central passage of the magnetic core, lateral extension arms extending from opposite ends of the central portion, and connection ends for connection to an external conductor. The secondary conductors comprising a plurality of conductors, each conductor comprising a sensing cell connection pad substantially aligned in a same plane with the central portion of the primary conductor and a connection end for connection to the external circuit. The insulating body comprises an inner overmold portion surrounding a central portion of the primary conductor and forming a core guide positioning and insulating the magnetic core with respect to the leadframe conductor arrangement.

The insulating body further comprises an outer overmold portion molded over the inner overmold portion, the magnetic core, magnetic field sensor, and a central portion of the leadframe conductor arrangement.

Also disclosed herein is a method of manufacturing an electrical current transducer comprising:

a) stamping or etching a blank of the leadframe conductor arrangement in a leadframe made of a strip of sheet metal, said blank connected with bridge attachments to the leadframe sheet metal strip, b) overmolding a central portion of the primary conductor and portions of the secondary conductions to form the inner overmold portion, c) subsequently mounting the sensing cell on the conductor leadframe arrangement and connecting the sensing cell to sensing connection pads of the secondary conductors, d) subsequently mounting the magnetic core on the inner overmold portion and optionally fixing it with a dispensed amount of glue or by clips, e) subsequently overmolding the outer overmold portion around the magnetic core, sensing cell, and inner overmold portion;

f) optionally subsequently plating the exposed portions of the leadframe;

g) subsequently stamping and forming the connection ends of the primary and secondary conductors;

h) subsequently severing the transducer from the leadframe sheet metal strip.

In an advantageous embodiment, the inner overmold portion is formed by injection molding of a thermoplastic polymer.

In an advantageous embodiment, the outer overmold portion is formed by transfer molding of a thermosetting polymer.

The inner overmold portion (30) comprises or consists of thermoplastic polymer.

In an advantageous embodiment, the thermoplastic polymer is selected from a group including PPS (polyphenylenesulphide), LCP (liquid crystal polymer), PA (polyamide).

The outer overmold portion comprises or consists of a thermosetting polymer.

In an advantageous embodiment, the thermosetting polymer is a semiconductor grade epoxy mold compound.

In an advantageous embodiment, the inner overmold portion comprises a primary portion molded over the central portion of the primary conductor, the overmold portion comprising the core guide lateral guide edges engaging opposite lateral sides of said magnetic core branch for laterally positioning the magnetic core branch with respect to the leadframe conductor arrangement. The core guide may further comprise a base layer arranged to position a lateral branch of the magnetic core thereagainst In an advantageous embodiment, the inner overmold portion consists of said primary portion and said core guide.

In an embodiment, the core guide further comprises a base layer extending from the primary portion and partially over the secondary conductors, on one side of the conductor lead arrangement opposed to a side against which the sensing cell of the magnetic field detector is mounted and connected.

In an advantageous embodiment, on a side of the leadframe conductor arrangement against which the sensing cell of the magnetic field detector is mounted, the magnetic core branch is separated by a gap from the inner overmold portion, said gap being filled with material of the outer overmold portion.

In an advantageous embodiment, the outer overmold portion completely encapsulates the magnetic core and inner overmold portion.

In an advantageous embodiment, the sensing cell is connected to the secondary conductor via bond wire connections.

In an embodiment, the sensing cell is mounted on the leadframe conductor arrangement on an underside of the leadframe conductor arrangement facing a mounting surface of the current transducer. In another embodiment, the sensing cell is mounted on the leadframe conductor arrangement on an upperside of the leadframe conductor arrangement facing away from a mounting surface of the current transducer.

Further objects and advantageous features of the invention will be apparent from the claims, from the detailed description, and annexed drawings, in which:

FIG. 3c is a side view of the magnetic core and leadframe conductor arrangement of the electrical current transducer of FIGS. 1c-1d;

FIGS. 4a to 4d illustrate in perspective views manufacturing steps of a current transducer according to embodiments of the invention;

FIG. 4e is a top view of the leadframe and current transducer of FIG. 4a, showing an outer overmolding in cross-section;

FIG. 6a is a perspective view of an electrical current transducer according to a second embodiment of the invention, showing an outer overmolding in partial cross-section;

FIG. 6b is a cross-sectional view through line 6b-6b of FIG. 6a;

FIG. 6a is a cross-sectional view through line 6c-6c of FIG. 6b, with an upper portion of the outer overmold removed;

FIGS. 7a and 7b are perspective exploded views of a magnetic core and leadframe conductor arrangement of the electrical current transducer of FIGS. 6a-6c.

Figure 1A:
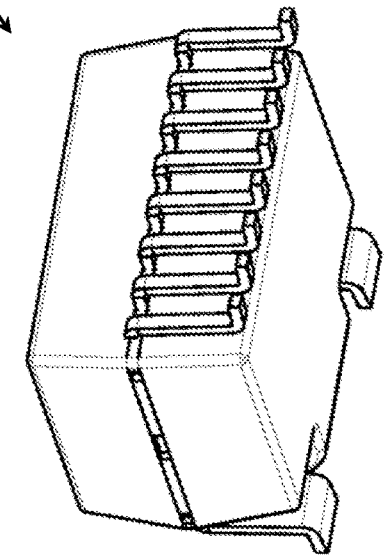
FIGS. 1a and 1b are perspective views of an electrical current transducer according to embodiments of the invention.
Figure 1B:
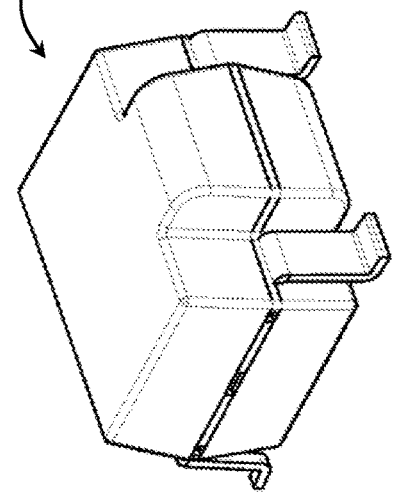
Figure 1D:
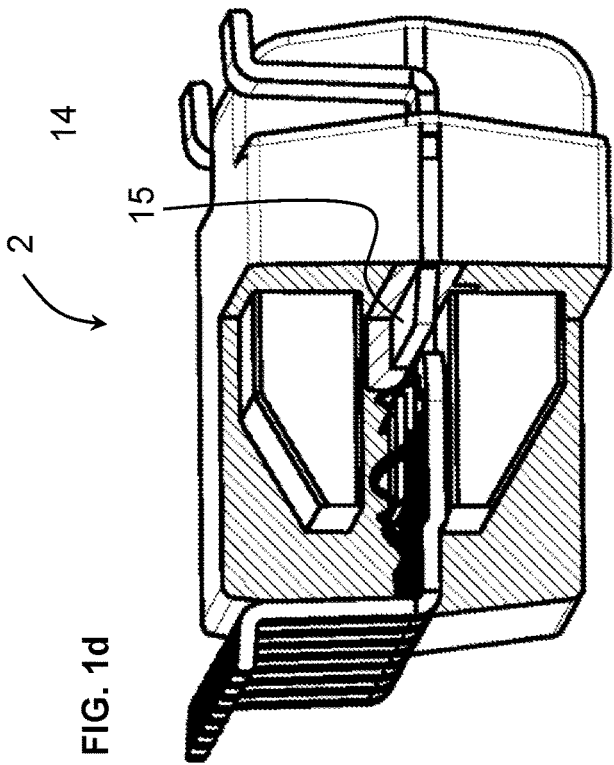
FIGS. 1c and 1d are perspective partial cross sectional views of an electrical current transducer according to a first embodiment of the invention.
Figure 1C:
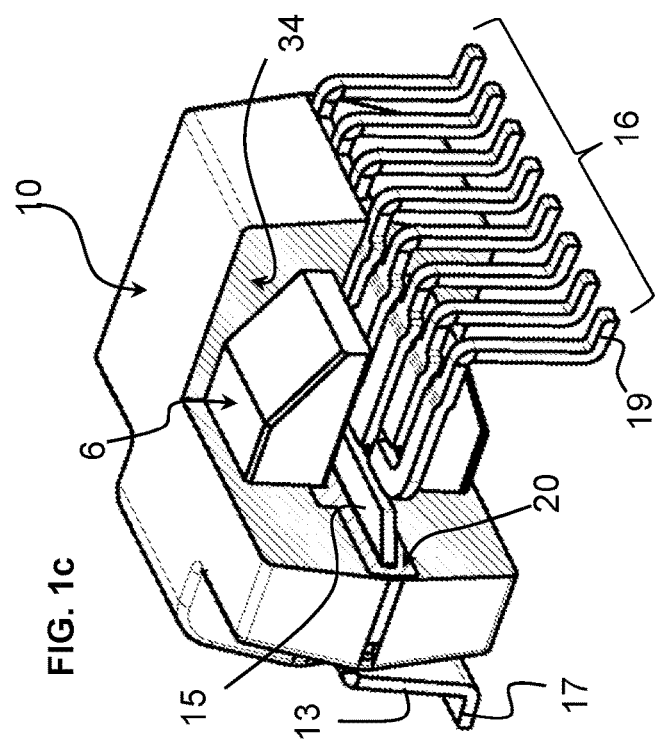

Referring to the figures, an electrical current transducer according to embodiments of the invention is shown, the current transducer comprising an insulating body 10, a magnetic core 6 comprising a central passage 18 and a magnetic circuit gap 22, a magnetic field detector 8 positioned in the magnetic circuit gap 22, and a conductor arrangement 4 made from a leadframe. The leadframe conductor arrangement 4 comprises a primary conductor 14 for carrying the current to be measured, and conductors 16 for connecting to the magnetic field detector 8. The current transducer of the present invention is particularly well suited for open loop current measurement.

The primary conductor 14 comprises a central portion 15, lateral extension arms 13 extending from opposite ends of the central portion 15 and connection ends 17 at the free ends of the extension arms for connection to an external conductor through which flows the current to be measured. The external conductor may in particular be connected to a circuit board (not shown) provided with conductive contacts for connection to the connection ends 17. The conductive contacts may for instance be in the form of conductive contact pads for surface mount connection of the connection ends 17. The central portion 15 of the primary conductor 14 extends through the central passage 18 of the magnetic core.

The magnetic core has a general U-shape formed by an end branch 6a and lateral branches 6b, 6c extending therefrom to free ends 24, the magnetic circuit gap 22 being formed between the lateral branches 6b, 6c proximate the free ends 24.

The magnetic core 6 acts as a magnetic flux concentrator for the magnetic field detector 8 positioned in the magnetic circuit gap 22. The magnetic flux generated by the current flowing in the primary conductor is concentrated through the magnetic circuit gap 22. The magnetic core is made of a material with a high magnetic permeability, examples of such magnetic materials being FeSi or NiFe alloys, MnZn or other ferrites, nanocrystalline materials, and amorphous materials. The magnetic core according to embodiments of the invention increases the signal level and provides good immunity against the external fields in comparison to current transducers that are not provided with a magnetic core, for instance in which the magnetic field detector is positioned proximate the primary conductor without a magnetic flux concentrator.

In an advantageous embodiment, the free end 24 of the lateral branches is provided with a chamfer 25 on an outer side of the lateral branches, the chamfer reducing the amount of magnetic material needed and reducing fringe fields.

The leadframe conductor arrangement 4 is stamped or etched and formed out of a single piece of sheet metal, whereby the central portion 15 of the primary conductor and the major portions of the magnetic field detector conductors 16 are substantially aligned and extend in a same major plane and comprise substantially identical thicknesses corresponding to the sheet metal thickness from which the conductor arrangement is formed. The connection ends 17 of the primary conductor 14 and connection ends 19 of the magnetic field detector conductors 16 may be bent out of the major plane to provide terminals for connection to an external circuit, in particular for connection to contact pads of the external circuit board.

The magnetic field detector conductors 16 comprise a plurality of conductors, each conductor comprising a connection end 19 for connection to the external circuit and a sensing cell connection pad 21 in the leadframe major plane for connection to the magnetic field detector 8. The magnetic field detector conductors comprise at least a pair of supply terminals for instance one being at a supply voltage Vc and the other at ground GND, and at least one signal out terminal Vout. The magnetic field detector conductors may further comprise a reference terminal Vref, a ground terminal and optionally supplementary signal out terminals, for instance for an overcurrent detection signal OCD.

The connection pads 21 may be provided with different shapes, surface areas and positions optimized for connection to the sensing cell 26. The magnetic field detector 8 comprises a sensing cell 26 and connection means, for instance in the form of bond wires 27. In the illustrated embodiments, the connection pads 21 are connected to the magnetic field detector by means of bond wire connections 27. Other interconnection means that are per se known in the art can however be provided between the sensing cell 26 and connection pads 21 of the leadframe conductor arrangement 4. For instance, the interconnection means may comprise a so called "flip chip" connection arrangement between a semiconductor substrate and metal contact pads, whereby for example solder beads interconnect connection areas on the sensing cell 26 to the connection pads 21 of the leadframe conductor arrangement 4.

The sensing cell 26 may, in a preferred embodiment, be in the form of a Hall sensor, per se well-known in the art of current transducers, that is formed in a semiconductor substrate (for instance a silicon substrate). Other sensing cell technologies may however also be adopted in the present invention, for instance fluxgate type of magnetic field detectors or giant magneto resistive type of magnetic field sensors. Hall sensors that are formed in a substantially planar semiconductor substrate are advantageous in view of their low cost, compactness, and robustness.

The sensing cell 26 may also be an arrangement of more than one semiconductor chip, for example a highly sensitive Hall chip adjacent to a signal processing chip.

The magnetic field detector conductors 16 and primary conductor central portion 15 are advantageously in the same plane (the major plane), or essentially the same plane, and are held together by an inner overmold portion 20 of the insulating body 10.

In the embodiment illustrated in FIGS. 2a-3c, the inner overmold portion 20 of the insulating body 10 is overmolded over portions of the secondary conductors of the leadframe conductor arrangement 4 while exposing connection pads 21 of the magnetic field detector conductors 16. The inner overmold portion 20 and leadframe conductor arrangement 4 present an essentially planar mounting surface with the connection pads 21 of the magnetic field detector conductors 16.

In an embodiment, for instance as illustrated in FIGS. 2a-3c, the sensing cell 26 is mounted on an an underside of the lead frame arrangement, facing a mounting plane of the conductor connection ends 17, 19.

The inner overmold portion 20 is overmolded around the central portion 15 of the primary conductor 14. The inner overmold portion 20 provides a dielectric insulating layer between the magnetic core and the primary conductor and optionally may provide in addition a positioning guide between the central passage of the magnetic core and the primary conductor, also ensuring proper positioning of the sensing cell 26 within the magnetic circuit gap 22.

The magnetic core 6 and leadframe conductor arrangement 4 with the inner overmold portion 20 of the present invention provides a particularly compact arrangement yet allowing the primary conductor to be well separated and insulated from the magnetic field detector conductors 16. The primary conductor central portion 15 can be provided with a large and unreduced cross section and at the same time have a good insulation separation distance from the sensing cell of the magnetic field detector in a compact footprint (i.e. surface area occupied by the electrical current transducer when positioned on an external circuit board).

The inner overmold portion 20 may advantageously comprise a core guide 32 comprising lateral guide edges 32b flanking opposite lateral sides of the magnetic core 6 to laterally position the magnetic core with respect to the leadframe arrangement 4 and sensing cell 26.

The inner overmold portion 20 comprises a primary portion 30 that is molded over the central portion 15 of the primary conductor 14.

In a first embodiment, as illustrated in FIGS. 2a to 3c, the inner overmold portion 20 comprises a secondary portion 31 that extends from the primary portion 30 and is partially overmolded over portions of the sensing cell connection pads 21 of the secondary conductors 16. The core guide 32 is substantially molded on one side 4a of the leadframe conductor arrangement 4, opposite the side 4b on which the sensing cell 26 of the magnetic field detector is mounted.

Figure 2A:
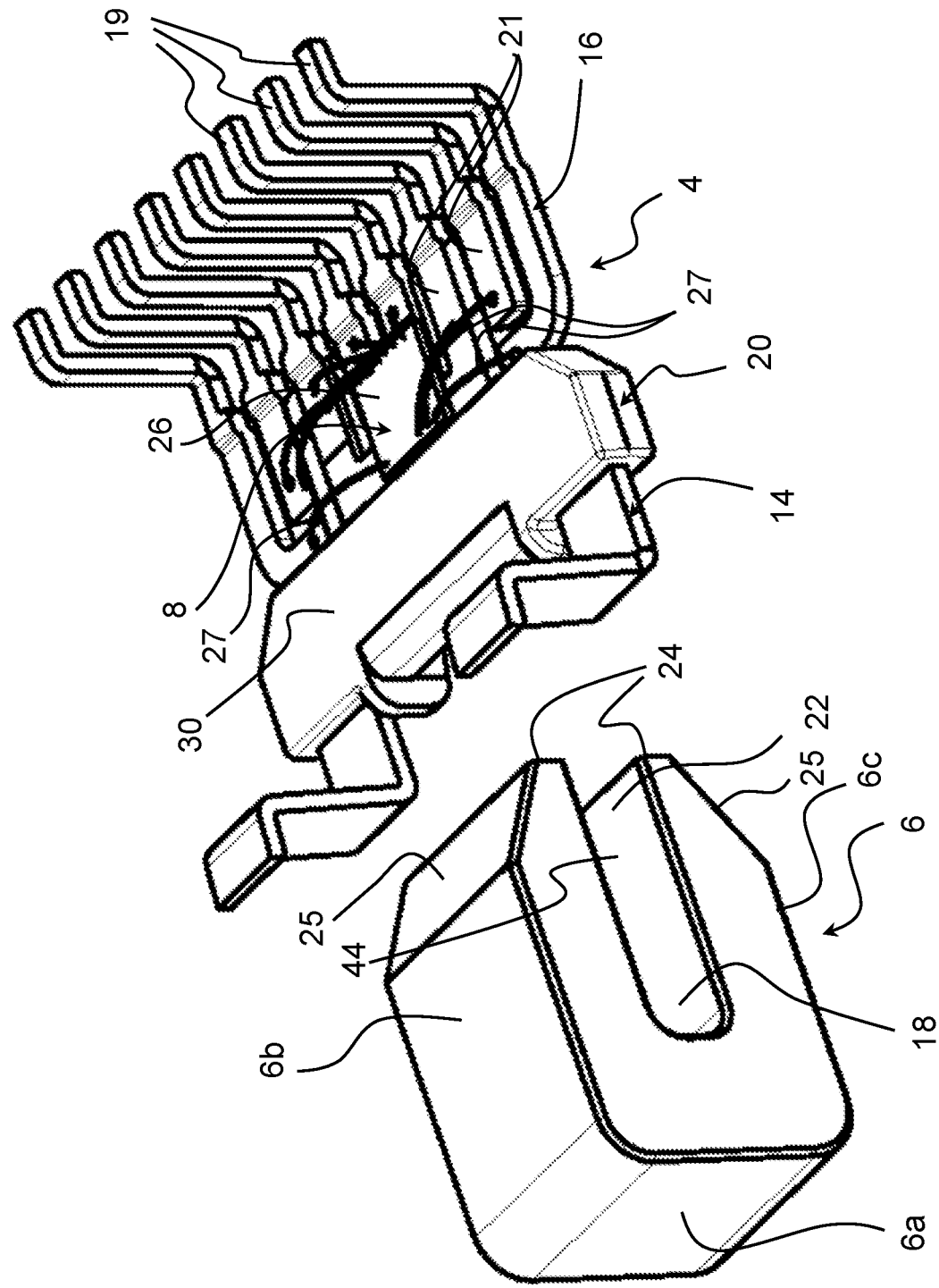
FIGS. 2a and 2b are exploded perspective views from opposite sides of a magnetic core and leadframe conductor arrangement of the electrical current transducer of FIGS. 1c-1d.
Figure 2B:
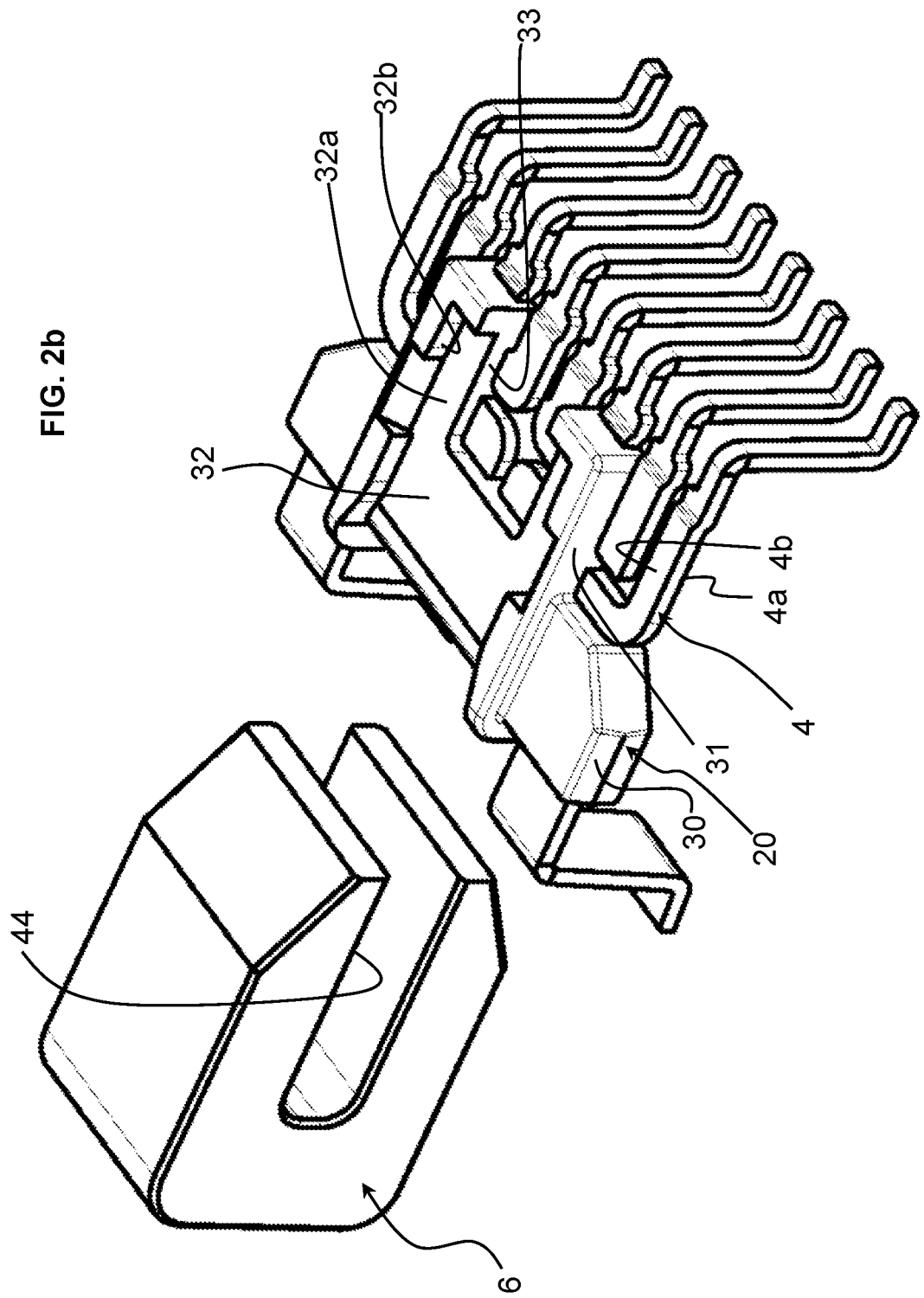
Figure 3B:
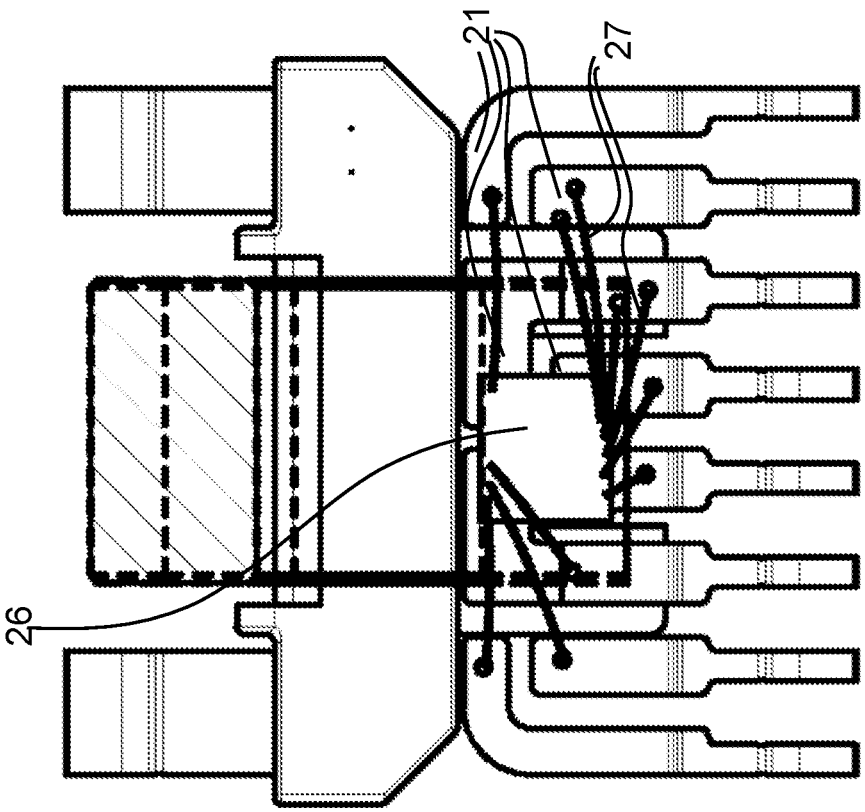
FIGS. 3a and 3b are cross-sectional plan views from opposite sides of the magnetic core and leadframe conductor arrangement of the electrical current transducer of FIGS. 1c-1d.
Figure 3A:
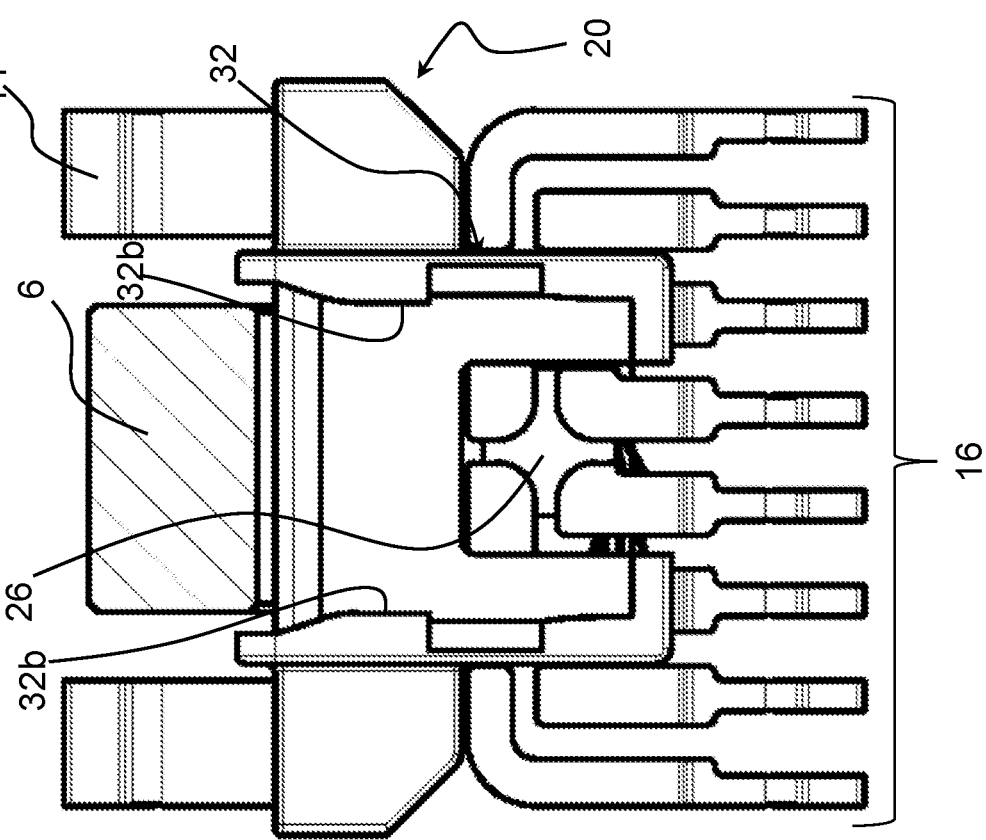

In the illustrated embodiment of FIGS. 2a to 3c, the core guide 32 comprises a base wall or layer 32a on an upper side 4b of the leadframe conductor arrangement, presenting a surface 32a against which an inner side 44 of an upper branch 6c of the magnetic core is positioned against. The base layer 32a provides an insulation layer that defines the distance between the magnetic core and the primary and secondary conductors 14, 16. As best seen in FIG. 3c, on the opposite side of the base layer 32a, the opposite lateral branch 6b of the magnetic core 6 is spaced with a certain gap 35 from the leadframe conductor arrangement 4 and the inner overmold portion 20. The sensing cell 26 and the bond wire connections 27 are positioned in the magnetic field circuit gap 22 between the free ends of the lateral branches 6b, 6c, this gap being filled with the material of the outer overmold portion 34.

In a second embodiment, as illustrated in FIGS. 6a to 7b, the inner overmold portion 20 does not extend over portions of the sensing cell connection pads 21 of the secondary conductors 16 and is separated therefrom by a gap that is filled with the outer overmold portion 34. An advantage of this configuration is to ensure a long electrical creepage distance between the primary conductor 14 and secondary conductors 16. In the interface between the inner overmold portion 20 and the outer overmold portion 34, in particular if two different materials are used, chemical bonding between the materials of the inner overmold portion and outer overmold portion may be incomplete or such that internal creepage currents can breakdown the insulation barrier. In this embodiment, the inner overmold portion surrounds only the primary conductor and does not have an interface with the secondary conductors 16, and the outer overmold portion 34 surrounds the secondary conductors 16 without interfacing with the inner overmold portion along a secondary conductor. There is therefore no interface between the inner and outer overmold portions along a portion of secondary conductor 16 thereby avoiding a creepage along an interface between overmold portions.

The inner overmold portion 20 serves to assemble the magnetic core 6 to the conductor lead arrangement 4, providing structural rigidity, positioning, and insulation between the conductor lead arrangement 4 and magnetic core 6, and between the primary and secondary conductors.

In a preferred embodiment, the inner overmold portion 20 is formed of a thermoplastic polymer that is preferably injection molded on the lead frame conductor arrangement 4 while it is still formed as a blank and connected to a lead frame 40 during the manufacturing process. This process is very advantageous for mass production in view of the rapidity of the injection molding process, including the rate of hardening of the thermoplastic material after injection, and the ease of passing the leadframe through a die for injection molding in a an economical manner. The overmolding of the inner overmold portion 20 prior to mounting and interconnection of the magnetic field detector 8 on the secondary conductors can be automated very well (in contrast to applying adhesive tape for example) and provides an insulating layer completely surrounding the primary lead in the vicinity of the magnetic field detector chip and other conductive parts of the secondary side.

In a variant, a transfer molding process with thermosetting plastics (for example an epoxy mold compound) may alternatively be used to form the inner overmold portion 20.

The leadframe 40 is formed of a strip of sheet metal 41 that is stamped in a stamping die to cut out portions of the strip of metal to form the blank shapes of the leadframe conductor arrangement and attachments thereof to the strip of metal during the stamping and forming process, such stamping processes being per se known in the art; for relatively low production quantities an etching process can be more economic.

The magnetic core 6 and the sensing cell 26 are assembled to the leadframe conductor arrangement while it is still attached to the leadframe 40. The leadframe 40 may thus pass through an injection molding, transfer molding or compression molding die for forming the inner overmold portion 20. The inner overmold portion in an embodiment may advantageously be made of a thermoplastic material.

In a variant, the inner overmold portion may also be made of a thermosetting material in a transfer molding process.

As best seen in FIG. 2b, in a first embodiment the inner overmold portion 20 comprises an opening 33 in the base layer 32a. The opening 33 is positioned opposite the sensing cell 26 mounted on the opposite side 4a of the leadframe conductor arrangement 4. The opening 33 may serve to avoid material overflowing during the molding process on the surface portion of the leadframe conductor arrangement 4 against which the sensing cell 26 is positioned and bonded.

During the manufacturing process, with the leadframe conductor arrangement 4 connected to the leadframe 40, after connection of the sensing cell 26 to the secondary conductors 16 and mounting of the magnetic core 6 over the inner overmold portion, the aforementioned assembly is fed into a transfer molding die having a die cavity corresponding substantially to the outer envelope of the outer overmold portion 34, and a thermosetting polymer is injected into the die cavity to fill said cavity and form the outer overmold portion. Thermosetting polymers in comparison to thermoplastic polymers may generally have a much lower viscosity and advantageously fill the spaces around the sensing cell 26, between the bonding wires 27, between the conductor lead arrangement conductors 14, 16 and also in the spaces between a magnetic core 6 and conductors, with relatively low hydrodynamic forces. The thermosetting polymer thus forms an excellent insulation barrier between the leadframe conductor arrangement, in particular between the primary and secondary conductors and between the primary conductor and magnetic core and sensing cell, in a compact and robust arrangement. In particular the thermosetting outer overmold portion 34 provides a particularly robust and stable securing of the magnetic core 6 to the leadframe conductor arrangement 4. Moreover, the formation of the inner overmold, the connection of the sensing cell to the leadframe, the molding of the magnetic core to the leadframe arrangement and the subsequent overmolding of the outer overmold portion may advantageously be performed while the leadframe conductor arrangement is formed as a blank still attached to the leadframe to facilitate accurate assembly of components and efficiency of the production process.

Figure 5A:
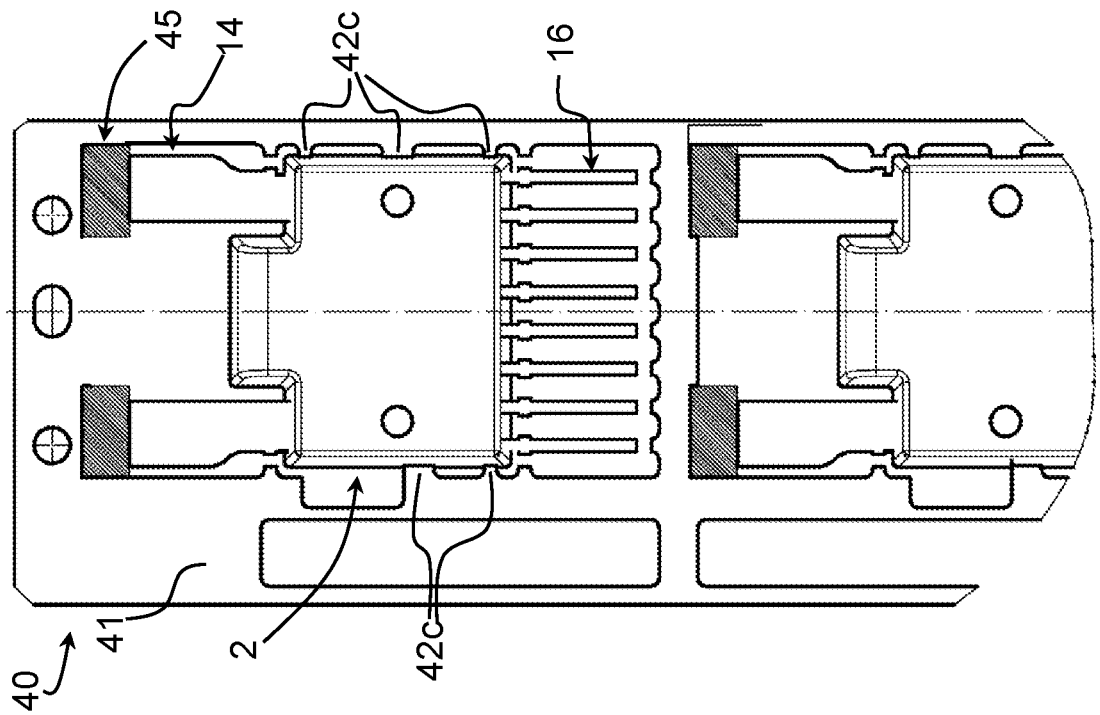
FIGS. 5a and 5b are plan views illustrating manufacturing steps according to FIGS. 4b and 4c respectively.

As best seen in FIGS. 4a and 5a, the leadframe conductor arrangement is in a planar shape with the primary and secondary conductors in a plane of the strip of sheet metal 41. After forming of the outer overmold portion 34, the primary conductor 14 and secondary conductors 16 may be severed from the strip of sheet metal 41 (FIGS. 4b and 4c) and bent into their final shapes (FIG. 4d) before the electric current transducer 2 is severed from the leadframe metal strip 41.

Figure 5B:
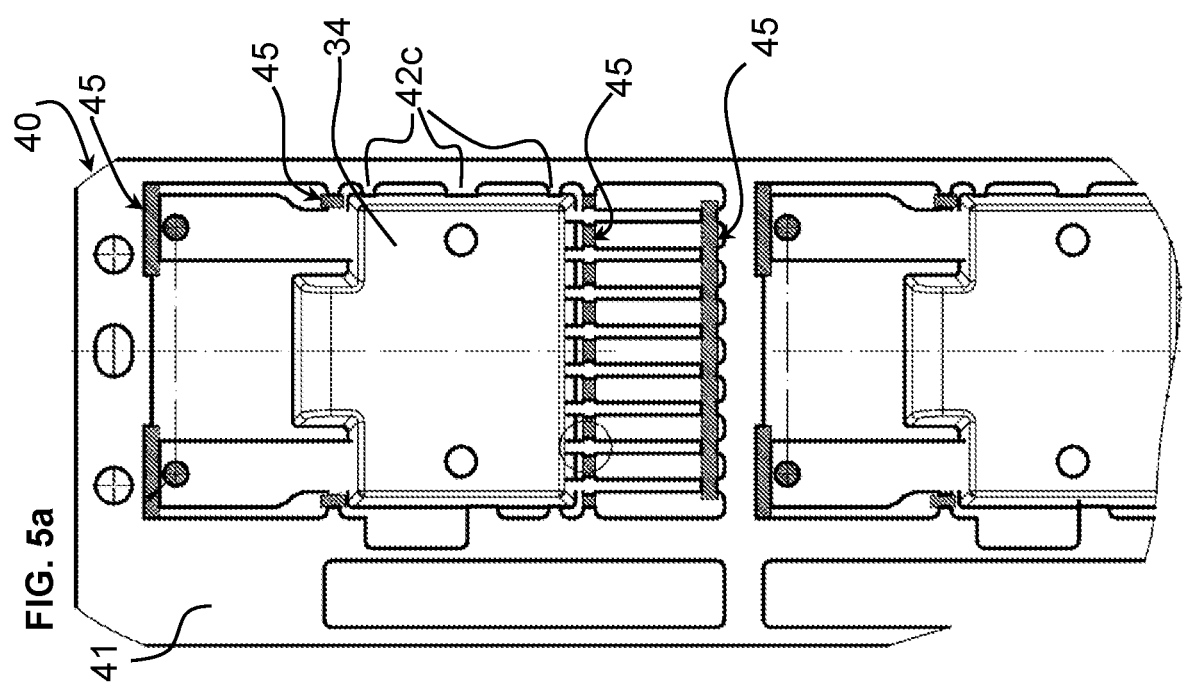

As shown in FIG. 4a, the leadframe conductor arrangement is connected to the leadframe 40 via a plurality of bridge attachments 42a, 42b, 42c, including primary conductor bridge attachments 42a, secondary current conductor bridge attachments 42b and transducer support attachments 42c. Furthermore, the leadframe conductor arrangement is connected to the leadframe via the conductor end attachments 43a, 43b, namely the primary conductor end attachments 43a and secondary conductor end attachments 43b. In a subsequent step, as illustrated in FIG. 4b, the primary and secondary conductors are cut away from the leadframe strip 41 by various associated cutting dies 45 as best illustrated in FIGS. 5a and 5b.

The various bridge attachments 42a, 42b between secondary conductors and leadframe strip 41 and between primary conductors and leadframe strip 41 serve to stabilize and provide secure position of the conductor leadframe arrangement during the stamping and subsequent molding and assembly steps mentioned above.

The primary and secondary conductors may then be bent into their final shapes as shown in FIG. 4d for connection to an external circuit board while the transducer remains connected to the leadframe strip 41. In a subsequent step, the transducer may be cut off the leadframe strip 41 by severing the transducer support attachments 42c.

A particularly robust, well insulated and compact transducer with a leadframe conductor arrangement may thus be provided in an efficient, accurate and economical manufacturing process.

LIST OF REFERENCES USED electric current transducer 2
leadframe conductor arrangement 4
primary conductor 14
    lateral extension arms 13
    central portion 15
    (circuit board) connection ends 17
Secondary (magnetic field detector) conductors 16
    (circuit board) connection ends 19
    sensing cell connection pads 21
magnetic core 6
    central passage 18
    magnetic circuit gap 22
    end branch 6a
    lateral branches 6b, 6c
        free end 24
magnetic field detector 8
    sensing cell 26
    connections (bond wires) 27
insulating body 10
inner overmold portion 20
    primary portion 30
    secondary portion 31
    core guide 32
        base 32a
            opening 33
        lateral guide 32b
outer overmold portion 34
leadframe 40
strip of sheet metal 41
    bridge attachments 42
        primary conductor bridge attachments 42a
        secondary conductor bridge attachments 42b
        transducer support attachments 42c
    conductor ends attachments 43
        primary conductor end 43a
        secondary conductor ends 43b
stamping (cutting) dies 45
external circuit board
    contact pads

The invention claimed is:

1. An electrical current transducer comprising:
an insulating body,
a magnetic core comprising a central passage and a magnetic circuit gap,
a magnetic field detector positioned in the magnetic circuit gap, and
a sheet metal leadframe conductor arrangement comprising a primary conductor for carrying the current to be measured and secondary conductors for connecting the magnetic field detector to an external circuit,
wherein the primary conductor comprises:
    a central portion extending through the central passage of the magnetic core,
    lateral extension arms extending from opposite ends of the central portion, and
    connection ends for connection to an external conductor,
wherein the secondary conductors comprise a plurality of conductors, each conductor comprising a sensing cell connection pad substantially aligned with the central portion of the primary conductor and a connection end for connection to the external circuit,
wherein the insulating body comprises an inner overmold portion surrounding the central portion of the primary conductor,
wherein the insulating body further comprises an outer overmold portion molded over the inner overmold portion, the magnetic core, magnetic field sensor, and a portion of the leadframe conductor arrangement, and
wherein the inner overmold portion comprises or consists of thermoplastic polymer and the outer overmold portion comprises or consists of a thermosetting polymer.

2. The current transducer of claim 1, wherein the thermoplastic polymer is selected from a group including PPS (polyphenylenesulphide), LCP (liquid crystal polymer), PA (polyamide).

3. The current transducer of claim 1, wherein the thermosetting polymer is a semiconductor grade epoxy mold compound.

4. The current transducer of claim 1, wherein the inner overmold portion comprises a primary portion molded over the central portion of the primary conductor, the primary portion comprising a core guide comprising lateral guide edges engaging opposite lateral sides of said magnetic core branch for laterally positioning the magnetic core branch with respect to the leadframe conductor arrangement.

5. The current transducer of claim 4, wherein the core guide comprises a base layer arranged to position a lateral branch of the magnetic core thereagainst.

6. The current transducer of claim 4, wherein the inner overmold portion consists of said primary portion and said core guide.

7. The current transducer of claim 4, wherein the core guide is provided on one side of the conductor lead arrangement, opposed to a side against which the sensing cell of the magnetic field detector is mounted and connected.

8. The current transducer of claim 7, wherein on said side of the leadframe conductor arrangement against which the sensing cell of the magnetic field detector is mounted, the magnetic core branch is separated by a gap from the inner overmold portion, said gap being filled with material of the outer overmold portion.

9. The current transducer of claim 1, wherein the outer overmold portion completely encapsulates the magnetic core and inner overmold portion.

10. The current transducer of claim 1, wherein the sensing cell is connected to the secondary conductor via bond wire connections.

11. Method of manufacturing the electrical current transducer of claim 1 comprising:
a) stamping or etching a blank of the leadframe conductor arrangement in a leadframe made of a strip of sheet metal, said blank connected with bridge attachments to the leadframe sheet metal strip,
b) overmolding a central portion of the primary conductor and portions of the secondary conductions to form the inner overmold portion,
c) subsequently mounting the sensing cell on the conductor leadframe arrangement and connecting the sensing cell to sensing connection pads of the secondary conductors, d) subsequently mounting the magnetic core on the inner overmold portion and optionally fixing it with a dispensed amount of glue or by clips, e) subsequently overmolding the outer overmold portion around the magnetic core, sensing cell, and inner overmold portion;

f) optionally subsequently plating the exposed portions of the leadframe;

g) subsequently stamping and forming the connection ends of the primary and secondary conductors;

h) subsequently severing the transducer from the leadframe sheet metal strip.

12. The method of claim 11, wherein the inner overmold portion is formed by injection molding of a thermoplastic polymer.

13. The method of claim 12, wherein the outer overmold portion is formed by transfer molding of a thermosetting polymer.

\* \* \* \* \*